(12) United States Patent
Nakamura et al.

(10) Patent No.: US 10,605,651 B2
(45) Date of Patent: Mar. 31, 2020

(54) INFRARED SENSOR

(71) Applicant: MITSUBISHI MATERIALS CORPORATION, Tokyo (JP)

(72) Inventors: Kenji Nakamura, Naka (JP); Kazuyoshi Tari, Saitama (JP); Shingo Hirano, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 16/072,282

(22) PCT Filed: Jan. 27, 2017

(86) PCT No.: PCT/JP2017/002914
§ 371 (c)(1),
(2) Date: Jul. 24, 2018

(87) PCT Pub. No.: WO2017/131151
PCT Pub. Date: Aug. 3, 2017

(65) Prior Publication Data
US 2019/0025115 A1   Jan. 24, 2019

(30) Foreign Application Priority Data

Jan. 29, 2016  (JP) .................................. 2016-016512
Jan. 5, 2017  (JP) .................................. 2017-000401

(51) Int. Cl.
*G01J 5/02* (2006.01)
*G01J 5/06* (2006.01)
(Continued)

(52) U.S. Cl.
CPC .............. *G01J 1/0252* (2013.01); *G01J 1/02* (2013.01); *G01J 5/02* (2013.01); *G01J 5/046* (2013.01);
(Continued)

(58) Field of Classification Search
CPC .... G01J 1/02; G01J 1/0252; G01J 5/02; G01J 5/046; G01J 5/20; G01J 2005/068; H05K 1/0271
See application file for complete search history.

(56) References Cited

U.S. PATENT DOCUMENTS

| 5,962,854 A | 10/1999 | Endo |
| 9,568,371 B2 | 2/2017 | Tari et al. |
| 2015/0043614 A1 | 2/2015 | Tari et al. |

FOREIGN PATENT DOCUMENTS

| JP | 09-329499 A | 12/1997 |
| JP | 2012-068115 A | 4/2012 |

(Continued)

OTHER PUBLICATIONS

International Search Report dated Apr. 18, 2017, issued for PCT/JP2017/002914 and English translation thereof.

*Primary Examiner* — Mark R Gaworecki
(74) *Attorney, Agent, or Firm* — Locke Lord LLP

(57) ABSTRACT

The infrared sensor according to the present invention includes an insulating film; a pair of first terminal electrodes; a pair of second terminal electrodes; a first heat sensitive element; a second heat sensitive element; a pair of first pattern wiring parts and a pair of second pattern wiring parts that are patterned on either surface of the insulating film; an infrared-receiving region that is provided on the other surface of the insulating film so as to oppose to the first heat sensitive element; and an infrared reflection film that is formed on the other surface of the insulating film so as to avoid the infrared-receiving region and to cover at least the portion immediately above the second heat sensitive element, wherein the infrared reflection film has a thermal coupling part in proximity to a portion of the first pattern wiring part.

5 Claims, 4 Drawing Sheets

(51) Int. Cl.
    *G01J 5/10*     (2006.01)
    *G01J 5/04*     (2006.01)
    *G01J 5/20*     (2006.01)
    *H05K 1/02*     (2006.01)
    *G01J 1/02*     (2006.01)

(52) U.S. Cl.
    CPC . *G01J 5/06* (2013.01); *G01J 5/10* (2013.01); *G01J 5/20* (2013.01); *H05K 1/0271* (2013.01); *G01J 2005/068* (2013.01)

(56) References Cited

FOREIGN PATENT DOCUMENTS

| | | |
|---|---|---|
| JP | 2013-156235 A | 8/2013 |
| JP | 2013-160635 A | 8/2013 |
| JP | 2015-172537 A | 10/2015 |

[FIG. 1]
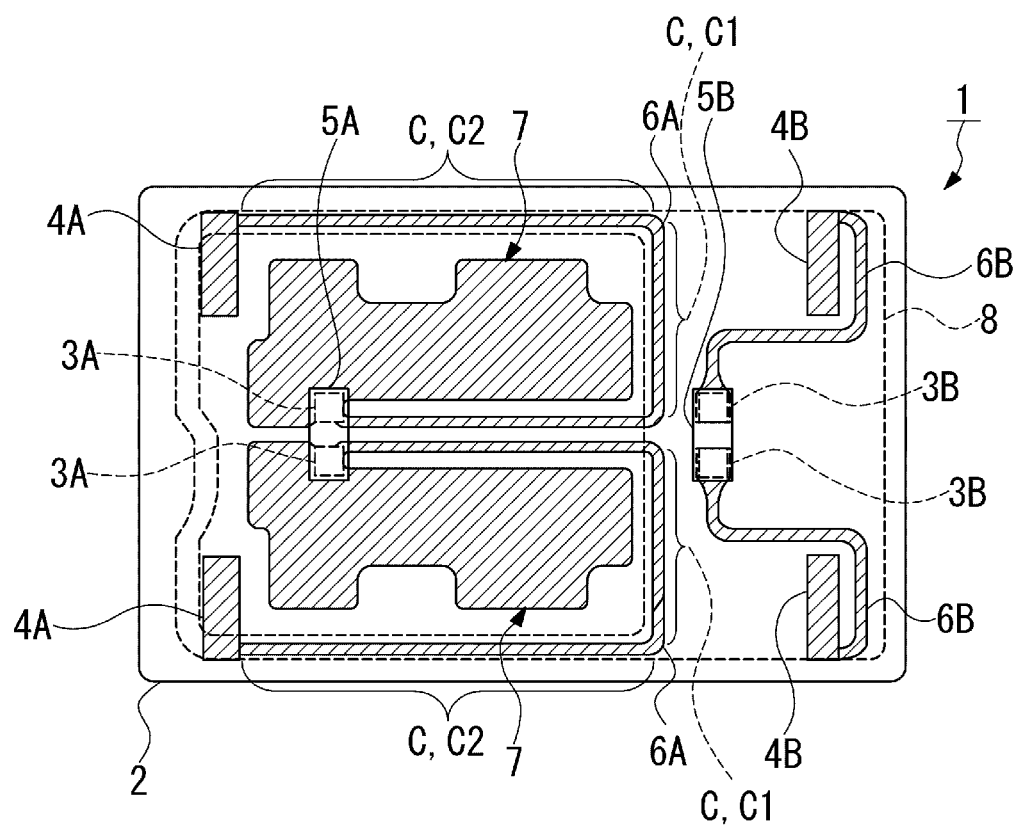

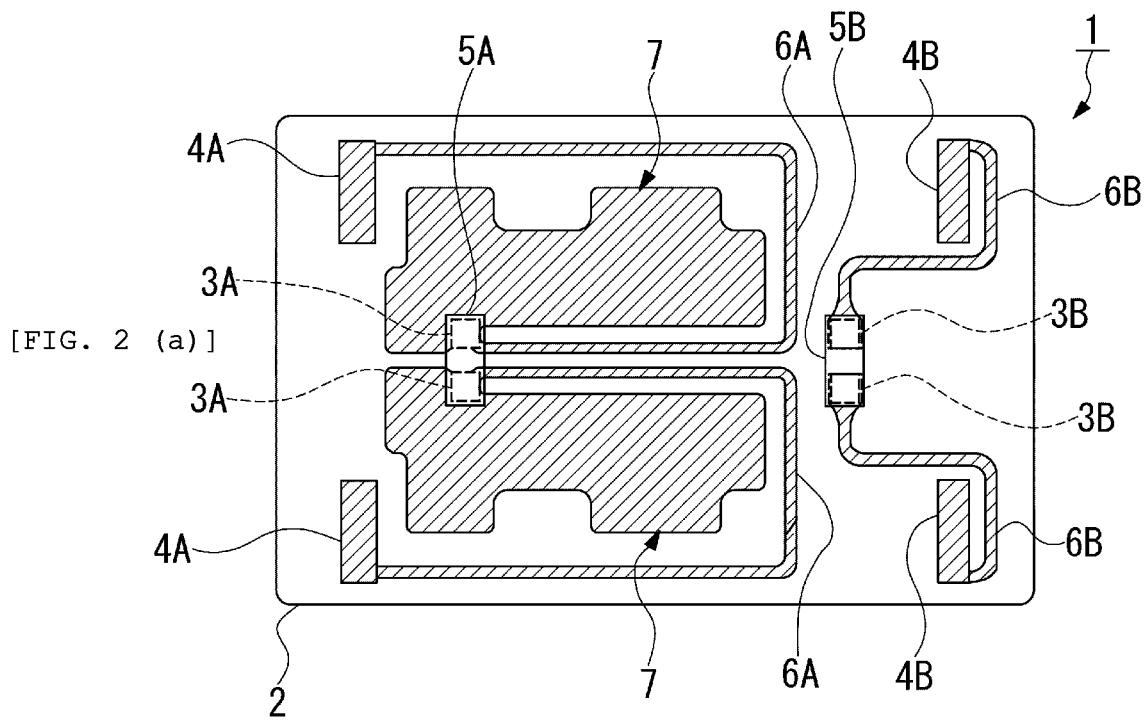
[FIG. 2 (a)]
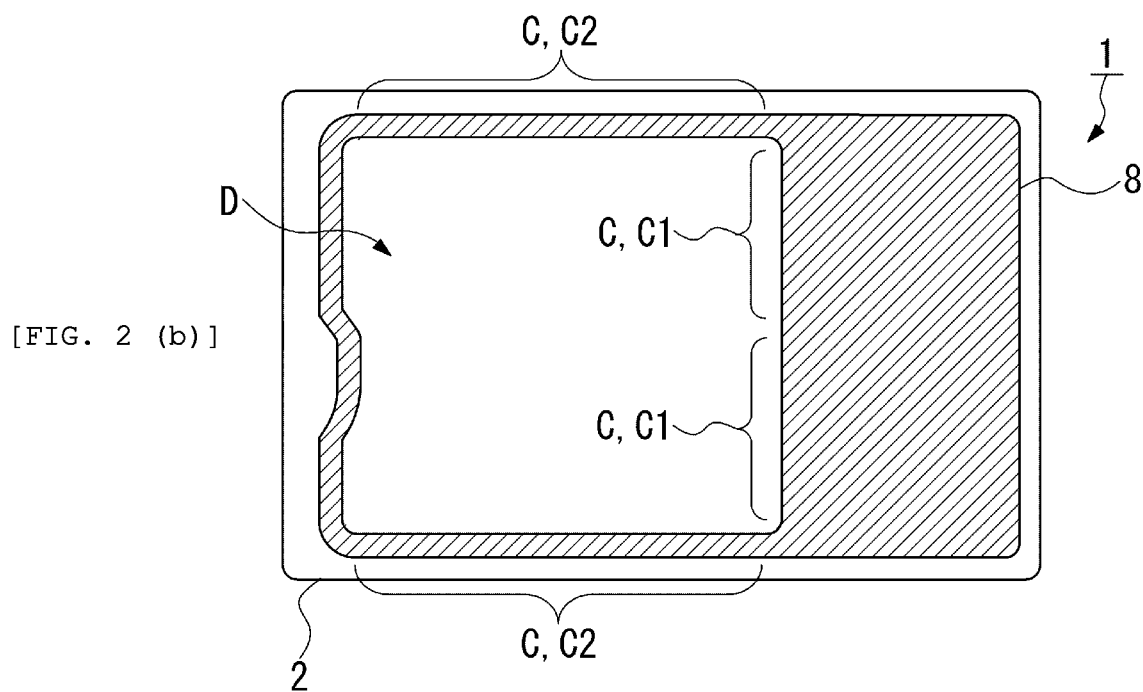
[FIG. 2 (b)]

[FIG. 3]
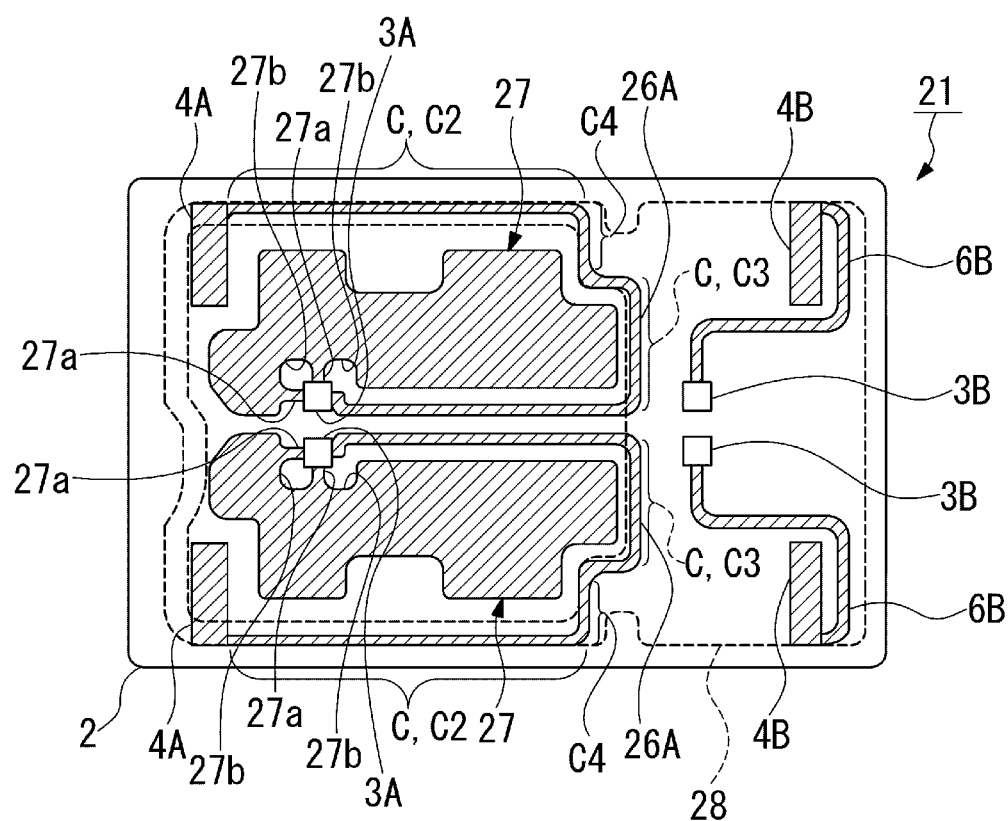

[FIG. 4]
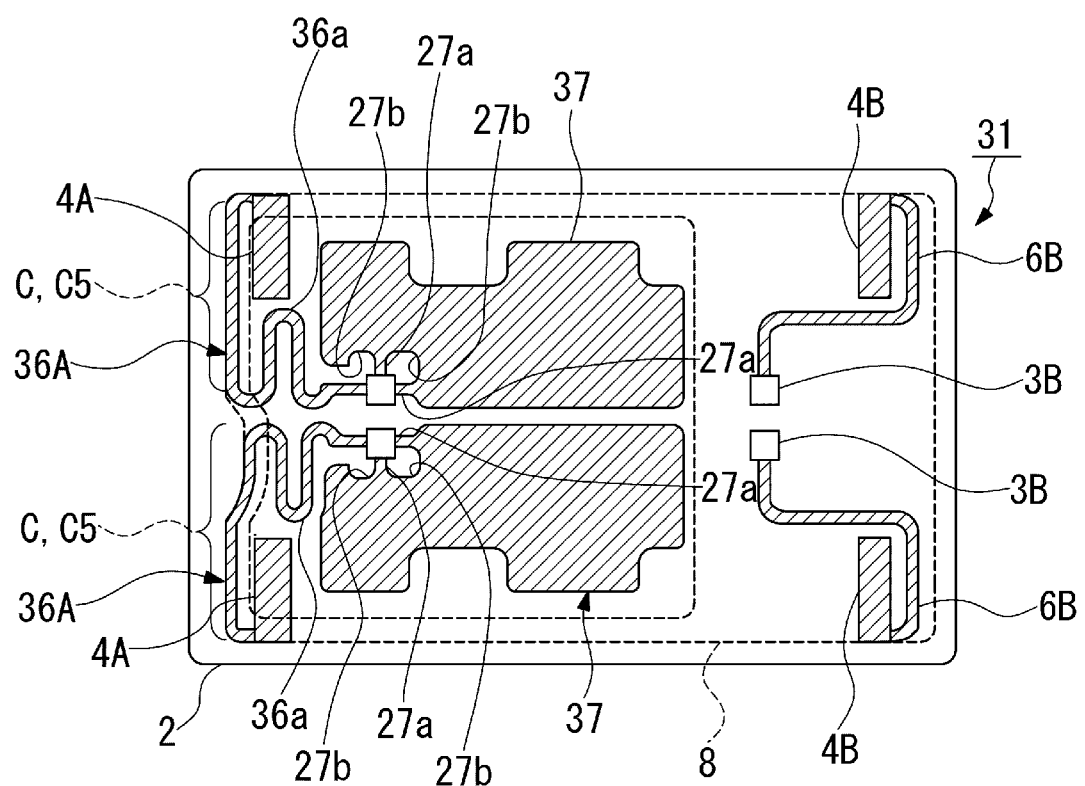

INFRARED SENSOR

CROSS REFERENCE TO RELATED APPLICATIONS

This application is related to co-pending application: "INFRARED SENSOR" filed on Jul. 18, 2018 as U.S. Ser. No. 16/070,917 in the names of Kenji NAKAMURA; Kazuyoshi TARI and Shingo HIRANO as a national phase entry of PCT/JP2017/002960, which application is assigned to the assignee of the present application and is incorporated by reference herein.

BACKGROUND OF THE INVENTION

Field of the Invention

The present invention relates to an infrared sensor having an excellent responsivity that is suitable for measuring a temperature of a heat roller used in a copying machine, printer, or the like.

Description of the Related Art

In general, in order to measure a temperature of an object to be measured such as a fuser roller or the like used in an image-forming apparatus such as a copying machine, printer, or the like, there is an infrared sensor installed opposing to the object to be measured so as to measure the temperature by receiving radiant heat from the object.

In recent years, a film-type infrared sensor has been developed as one of such infrared sensors, in which a thin film thermistor is formed on an insulating film so that the sensor can have an excellent flexibility and a thin profile as a whole.

For example, Patent document 1 discloses an infrared sensor that includes an insulating film; first and second heat sensitive elements that are provided so as to be spaced apart from each other on either surface of the insulating film; first and second conductive wiring films that are formed on either surface of the insulating film and are connected to first and second heat sensitive elements respectively; and an infrared reflection film that is provided on the other surface of the insulating film so as to oppose to the second heat sensitive element.

PRIOR ART DOCUMENT

Patent Document

[Patent Document 1] Japanese Unexamined Patent Application Publication No. 2013-160635

SUMMARY OF THE INVENTION

Problems to be Solved by the Invention

The following problems still remain in the conventional technologies described above.

Specifically, in the case of the conventional infrared sensor described above, when an environmental temperature is changed, for example when a temperature of either the infrared-receiving side or the compensation side is changed due to the influence of convection of the surrounding air, a problem occurs that heat can easily escape through a wiring film to a terminal electrode in the side where the temperature has been changed. As a consequence, the heat balance between the infrared-receiving side and the compensation side can be inconveniently slowly converged, thereby reducing the thermal responsivity.

The present invention has been made in view of the aforementioned circumstances, and an object of the present invention is to provide an infrared sensor that allows the heat balance to be quickly converged, thereby improving the thermal responsivity.

Means for Solving the Problems

The present invention adopts the following configuration in order to overcome the aforementioned problems. Specifically, an infrared sensor according to a first aspect of the present invention comprises: an insulating film; a pair of first terminal electrodes and a pair of second terminal electrodes that are patterned on either surface of the insulating film; a first heat sensitive element and a second heat sensitive element that are provided on either surface of the insulating film; a pair of first pattern wiring parts that is patterned on either surface of the insulating film with one end thereof being connected to the first heat sensitive element and the other end thereof being connected to the pair of first terminal electrodes; a pair of second pattern wiring parts that is patterned on either surface of the insulating film with one end thereof being connected to the second heat sensitive element and the other end thereof being connected to the pair of second terminal electrodes; an infrared-receiving region that is provided on the other surface of the insulating film so as to oppose to the first heat sensitive element; and an infrared reflection film that is formed on the other surface of the insulating film so as to avoid the infrared-receiving region and to cover at least the portion immediately above the second heat sensitive element, wherein the infrared reflection film has a thermal coupling part in proximity to a portion of the first pattern wiring part.

In this infrared sensor, since the infrared reflection film has the thermal coupling part in proximity to a portion of the first pattern wiring part, the thermal coupling part thermally couples to a portion of the first pattern wiring part so that an environmental temperature change can be efficiently transmitted mutually between the infrared-receiving side and the compensation side. As a consequence, the heat balance between the infrared-receiving side and the compensation side can be quickly converged, thereby improving the thermal responsivity. In addition, since the insulating film is thin, the heat present on one surface can be quickly transmitted to the infrared reflection film formed on the other surface through the thermal coupling part. In particular, when the infrared reflection film is made of a metal film, heat can be transmitted mutually between the infrared-receiving side and the compensation side with a high thermal conductivity so that the heat balance can be quickly converged.

An infrared sensor according to a second aspect of the present invention is characterized by the infrared sensor according to the first aspect of the present invention, wherein the thermal coupling part is formed so as to oppose to a portion of the first pattern wiring part.

Specifically, in this infrared sensor, since the thermal coupling part is formed so as to oppose to a portion of the first pattern wiring part, the thermal coupling part can be in the closest proximity to a portion of the first pattern wiring part through the thin insulating film, and thus excellent thermal coupling properties can be obtained.

An infrared sensor according to a third aspect of the present invention is characterized by the infrared sensor according to the first or second aspect, wherein the first pattern wiring part extends to the region in the vicinity of the outer edge of the insulating film, and the thermal coupling part has an outer-edge-vicinity coupling portion opposed to the first pattern wiring part in the vicinity region.

Specifically, in this infrared sensor, since the thermal coupling part has the outer-edge-vicinity coupling portion opposed to the first pattern wiring part in the vicinity region, heat can also be transmitted from the region in the vicinity of the outer edge of the insulating film by the outer-edge-vicinity coupling portion.

An infrared sensor according to a fourth aspect of the present invention is characterized by the infrared sensor according to any one of the first to third aspects, wherein the first pattern wiring part extends to the vicinity of the second heat sensitive element, the thermal coupling part has a compensation-side-vicinity coupling portion opposed to a portion of the first pattern wiring part extending to the vicinity of the second heat sensitive element.

Specifically, in this infrared sensor, since the thermal coupling part has a compensation-side-vicinity coupling portion opposed to a portion of the first pattern wiring part extending to the vicinity of the second heat sensitive element, the heat present on the infrared-receiving side is transmitted through the first pattern wiring part to the compensation side, and the compensation-side-vicinity coupling portion thermally couples to the first pattern wiring part in the vicinity of the second heat sensitive element so as to transmit heat over the infrared reflection film on the compensation side, which allows the heat balance to be more quickly converged.

An infrared sensor according to a fifth aspect of the present invention is characterized by the infrared sensor according to any one of the first to fourth aspects, wherein the first pattern wiring part extends to the vicinity of the end of the insulating film on the first heat sensitive element side, and the thermal coupling part has an infrared-receiving-side-end coupling portion opposed to a portion of the first pattern wiring part extending to the vicinity of the end of the insulating film on the first heat sensitive element side.

Specifically, in this infrared sensor, since the thermal coupling part has an infrared-receiving-side-end coupling portion opposed to a portion of the first pattern wiring part extending to the vicinity of the end of the insulating film on the first heat sensitive element side, heat can be easily transmitted from the furthermost end from the compensation side, thereby improving the thermal responsivity.

An infrared sensor according to a sixth aspect of the present invention is characterized by the infrared sensor according to any one of the first to fifth aspects, wherein the infrared reflection film is formed so as to also cover the periphery of the infrared-receiving region.

Specifically, in this infrared sensor, since the infrared reflection film is formed so as to also cover the periphery of the infrared-receiving region, an environmental temperature change transmitted through the thermal coupling part can also be transmitted over the periphery of the infrared-receiving region, which further allows the heat balance to be quickly converged. Therefore, the temperature gradient between the first heat sensitive element side and the second heat sensitive element side due to air convection can be small, which allows the response speed of the two heat sensitive elements to be equivalent.

For example, when the infrared reflection film is formed only in the region opposed to the second heat sensitive element, as air flows from the second heat sensitive element side due to convection of the surrounding air, the infrared reflection film above the second heat sensitive element can get cold, and this causes the temperature of the insulating film to be locally changed. By contrast, in the infrared sensor of the present invention, since the infrared reflection film is formed so as to also cover the periphery of the infrared-receiving region opposed to the first heat sensitive element, even when the region of the second heat sensitive element side gets cold due to air flow, the temperature of the periphery of the infrared-receiving region also be lowered due to the thermal conductivity of the infrared reflection film. Therefore, the temperature difference is hard to occur as a whole, resulting in less influence of convection of the surrounding air. In addition, since the infrared-receiving region above the first heat sensitive element is not covered by the infrared reflection film, the reception of infrared radiation from an object to be measured is not blocked.

Effects of the Invention

According to the present invention, the following effects may be provided.

Specifically, in the infrared sensor of the present invention, since the infrared reflection film has the thermal coupling part in proximity to a portion of the first pattern wiring part, an environmental temperature change can be efficiently transmitted mutually between the infrared-receiving side and the compensation side through the thermal coupling part, the heat balance between the infrared-receiving side and the compensation side can be quickly converged, thereby improving the thermal responsivity.

Therefore, the infrared sensor of the present invention has a high thermal responsivity and is suitable for measuring a temperature of a heat roller used in a copying machine, printer, and the like.

BRIEF DESCRIPTION OF THE DRAWINGS

FIG. 1 is a plan view illustrating an infrared sensor according to a first embodiment of the present invention.

FIG. 2 (a) shows a plan view and FIG. 2 (b) shows a back side view illustrating the infrared sensor according to the first embodiment.

FIG. 3 is a plan view illustrating an infrared sensor according to a second embodiment of the present invention with heat sensitive elements being removed.

FIG. 4 is a plan view illustrating an infrared sensor according to a third embodiment of the present invention with heat sensitive elements being removed.

DESCRIPTION OF THE EMBODIMENTS

Hereinafter, an infrared sensor according to a first embodiment of the present invention will be described with reference to FIGS. 1 and 2.

As shown in FIGS. 1 and 2, an infrared sensor 1 according to the present embodiment includes an insulating film 2; a pair of first terminal electrodes 4A and a pair of second terminal electrodes 4B that are patterned on either surface (face) of the insulating film 2; a first heat sensitive element 5A and a second heat sensitive element 5B provided on either surface of the insulating film 2; a pair of first pattern wiring parts 6A that is patterned on either surface of the insulating film 2 with one end thereof being connected to the first heat sensitive element 5A and the other end thereof being connected to a the pair of first terminal electrodes 4A; a pair of second pattern wiring parts 6B that is patterned on either surface of the insulating film 2 with one end thereof being connected to the second heat sensitive element 5B and the other end thereof being connected to the pair of second terminal electrodes 4B; an infrared-receiving region D that is provided on the other surface of the insulating film 2 (surface on the infrared-receiving side, back surface) so as to oppose to the first heat sensitive element 5A; and an infrared reflection film 8 that is formed on the other surface of the insulating film 2 so as to avoid the infrared-receiving region D and to cover at least the portion immediately above the second heat sensitive element 5B.

The infrared sensor 1 according to the present embodiment also includes a pair of heat transfer films 7 that is connected to a pair of first adhesive electrodes 3A besides the first pattern wiring parts 6A and is patterned on either surface of the insulating film 2 in the vicinity of the first adhesive electrodes 3A using a thin film having a higher thermal conductivity than that of the insulating film 2.

The infrared reflection film 8 has a thermal coupling part C in proximity to a portion of the first pattern wiring part 6A.

This thermal coupling part C is for thermally coupling to a portion of the first pattern wiring part 6A, and is formed so as to oppose to a portion of the first pattern wiring part 6A.

The pair of first pattern wiring parts 6A has the pair of first adhesive electrodes 3A with one end thereof being connected to the first heat sensitive element 5A. In addition, the pair of second pattern wiring parts 6B has a pair of second adhesive electrodes 3B with one end thereof being connected to the second heat sensitive element 5B.

The first pattern wiring part 6A extends to the vicinity of the second heat sensitive element 5B. In addition, the thermal coupling part C has a compensation-side-vicinity coupling portion C1 opposed to a portion of the first pattern wiring part 6A extending to the vicinity of the second heat sensitive element 5B.

Also, the first pattern wiring part 6A further extends to a vicinity region of the outer edge of the insulating film 2. In addition, the thermal coupling part C has an outer-edge-vicinity coupling portion C2 opposed to the first pattern wiring part 6A in the vicinity region.

Furthermore, the infrared reflection film 8 is formed so as to also cover the periphery of the infrared-receiving region D.

As described above, the pair of first pattern wiring parts 6A extends from the pair of first adhesive electrodes 3A towards the side opposite to the pair of first terminal electrodes 4A and further extends along a portion of the outer periphery of the pair of heat transfer films 7 so as to reach their respective first terminal electrodes 4A.

Specifically, the first pattern wiring parts 6A first extend from the first adhesive electrodes 3A between the pair of heat transfer films 7 towards the second heat sensitive element 5B, and then extend in the direction along the short side of the insulating film 2 towards the long side thereof in the vicinity of the end of the pair of heat transfer films 7. A portion of the infrared reflection film 8 on the compensation side is formed so as to oppose to this extending portion, and this portion is referred to as a compensation-side-vicinity coupling portion C1. Furthermore, the first pattern wiring part 6A extends outside the heat transfer film 7 along the long side of the insulating film 2 to the first terminal electrode 4A. The infrared reflection film 8 extends so as to oppose to this extending portion in the vicinity of the outer edge of the insulating film 2, and this portion is referred to as the outer-edge-vicinity coupling portion C2.

In addition, the second pattern wiring part 6B extends for a shorter distance than the first pattern wiring part 6A so as to reach the second terminal electrode 4B.

The first pattern wiring part 6A and the heat transfer film 7 are not in a direct contact with each other, but are indirectly connected to each other through the first adhesive electrode 3A.

The heat transfer film 7 is formed so as to have a larger area than that of the first pattern wiring part 6A.

The connection width of the heat transfer film 7 to the first adhesive electrode 3A is set to be wilder than that of the first pattern wiring part 6A to the first adhesive electrode 3A. Specifically, the heat transfer film 7 is connected to entirely two of the four sides of the first adhesive electrode 3A having a square shape, whereas the first pattern wiring part 6A is connected to one of the four corners of the first adhesive electrode 3A. Thus, the connecting part of the heat transfer film 7 to the first adhesive electrode 3A is set separately from the connecting part of the first pattern wiring part 6A to the first adhesive electrode 3A.

To the first adhesive electrode 3A and the second adhesive electrode 3B are adhered their respective terminal electrodes of the first heat sensitive element 5A and the second heat sensitive element 5B with a conductive adhesive such as a solder.

The infrared reflection film 8 is formed so as to avoid the portion immediately above the pair of heat transfer films 7.

Specifically, in the present embodiment, the first heat sensitive element 5A that is arranged immediately under the surface for receiving infrared radiation is an element for detecting infrared radiation, and the second heat sensitive element 5B that is arranged immediately under the infrared reflection film 8 is an element for compensation.

In FIG. 1, the infrared reflection film 8 formed on the back side is indicated with a dashed line. In addition, in FIG. 2(a) and FIG. 2 (b), each of the terminal electrodes, each of the pattern wiring parts, the heat transfer films 7, and the infrared reflection film 8 are indicated by hatching.

The insulating film 2 is made of a polyimide resin sheet having a generally rectangular shape, while the infrared reflection film 8, each of the pattern wiring parts, each of the terminal electrodes, each of the adhesive electrodes, and the heat transfer films 7 are made of a copper foil. Specifically, these elements compose a double-sided flexible substrate in which the infrared reflection film 8, each of the pattern wiring parts, each of the terminal electrodes, each of the adhesive electrodes, and the heat transfer films 7 made of copper foil are patterned on both surfaces of the insulating film 2 as a polyimide substrate.

The pair of first terminal electrodes 4A and the pair of second terminal electrodes 4B are arranged in the vicinity of the corners of the insulating film 2.

The infrared reflection film 8 is composed of the copper foil as described above and a gold plating film that is laminated on the copper foil.

This infrared reflection film 8 is made of a material having a higher infrared reflectance than that of the insulating film 2 and is formed by coating a copper foil with a gold plating film as described above. This film may be made of, for example, a mirror finished aluminum vapor-deposited film, aluminum foil, or the like other than the gold plating film.

The first heat sensitive element 5A and the second heat sensitive element 5B are chip thermistors at both ends of which terminal electrodes (not shown) are formed. Such thermistors include NTC-type, PTC-type, CTR-type thermistors, and the like, but in the present embodiment, a NTC-type thermistor is employed for the first heat sensitive element 5A and the second heat sensitive element 5B, for example. This thermistor is made of a Mn—Co—Cu or Mn—Co—Fe based thermistor material, or the like.

As described above, in the infrared sensor 1 according to the present embodiment, since the infrared reflection film 8 has the thermal coupling part C in proximity to a portion of the first pattern wiring part 6A, the thermal coupling part C thermally couples to a portion of the first pattern wiring part 6A so that an environmental temperature change can be efficiently transmitted mutually between the infrared-receiving side and the compensation side. As a consequence, the heat balance between the infrared-receiving side and the compensation side can be quickly converged, thereby improving the thermal responsivity.

In particular, since the thermal coupling part C is formed so as to oppose to a portion of the first pattern wiring part 6A, the thermal coupling part C can be in the closest proximity to a portion of the first pattern wiring part 6A through the thin insulating film 2, and thus excellent thermal coupling properties can be obtained.

In addition, since the thermal coupling part C has the outer-edge-vicinity coupling portion C2 opposed to the first pattern wiring part 6A in the vicinity region, heat can be transmitted from the region in the vicinity of the outer edge of the insulating film 2 by the outer-edge-vicinity coupling portion C2.

In particular, since the infrared reflection film 8 is formed so as to also cover the periphery of the infrared-receiving region D, an environmental temperature change transmitted through the outer-edge-vicinity coupling portion C2 is also transmitted over the periphery of the infrared-receiving region D, which further allows the heat balance to be quickly converged. Therefore, the temperature gradient between the first heat sensitive element 5A side and the second heat sensitive element 5B side due to air convection can be small, which allows the response speed of the two heat sensitive elements to be equivalent.

Furthermore, since the thermal coupling part C has the compensation-side-vicinity coupling portion C1 opposed to a portion of the first pattern wiring part 6A extending to the vicinity of the second heat sensitive element 5B, the heat present on the infrared-receiving side is transmitted to the compensation side through the first pattern wiring part 6A, and the compensation-side-vicinity coupling portion C1 thermally couples to the first pattern wiring part 6A in the vicinity of the second heat sensitive element 5B so as to transmit heat over the infrared reflection film 8 on the compensation side, which allows the heat balance to be more quickly converged.

Next, infrared sensors according to a second and third embodiments of the present invention will be described below with reference to FIGS. 3 and 4. Note that, in the following description of each embodiment, the same components as those in the first embodiment described above are denoted by the same reference numerals, and thus the description thereof is omitted. In FIGS. 3 and 4, the infrared reflection film 8 that is formed on the other surface of the insulating film 2 is indicated with a dashed line.

The second embodiment is different from the first embodiment in the following points. In the first embodiment, the pair of first pattern wiring parts 6A extends in a straight line in the direction along the short side of the insulating film 2 towards the long side thereof in the vicinity of the end of the pair of heat transfer films 7, whereas in an infrared sensor 21 according to the second embodiment, as shown in FIG. 3, a pair of first pattern wiring parts 26A extends so as to be bent in a crank shape in the direction along the short side of the insulating film 2 towards the long side thereof in the vicinity of the end of a pair of heat transfer films 27. Specifically, the infrared reflection film 28 is also formed so as to correspond to these extending portions, that is, compensation-side-vicinity coupling portions C3 and C4 are formed in a crank shape.

In addition, in the first embodiment, the heat transfer film 7 is connected without any gap to entirely two of the four sides of the first adhesive electrode 3A having a square shape, whereas in the infrared sensor 21 according to the second embodiment, as shown in FIG. 3, the heat transfer film 27 is connected to partially two of the four sides of the first adhesive electrode 3A having a square shape through constricted portions 27a.

As described above, even when the pair of first pattern wiring parts 26A extends so as to be bent in a crank shape in the direction along the short side of the insulating film 2 towards the long side thereof in the vicinity of the end of the pair of heat transfer films 27 in the second embodiment, since the infrared reflection film 28 is also formed so as to correspond to these extending portions, the compensation-side-vicinity coupling portions C3 and C4 can be defined so as to have an equivalent length as in the case of being formed in a straight line, and thus a sufficient thermal coupling can be obtained.

In addition, since the constricted portion 27a is formed at the connecting part of the heat transfer film 27 to the first adhesive electrode 3A, the constricted portion 27a can function as a thermal land, and thus, heat does not escape to the surrounding area beyond necessity during soldering. As a consequence, poor soldering resulting from undissolved solder can be suppressed.

Next, the difference of a third embodiment from the second embodiment will be described below. In the second embodiment, the first pattern wiring parts 6A extend from the first adhesive electrodes 3A towards the second heat sensitive element 5B side and further extend outside the heat transfer films 27 so as to reach the first terminal electrodes 4A and therefore the outer-edge-vicinity coupling portion C2 and the compensation-side-vicinity coupling portions C3 and C4 are formed, whereas in the infrared sensor 31 according to the third embodiment, as shown in FIG. 4, a pair of first pattern wiring parts 36A extends from the pair of first adhesive electrodes 3A to the direction opposite to that in the first embodiment and then passes through tortuous portions 36a formed by several folding so as to reach their respective first terminal electrodes 4A and therefore an infrared-receiving-side-end coupling portion C5 is formed in the vicinity of the end of the insulating film 2 on the first heat sensitive element 5A side.

Specifically, in the third embodiment, the thermal coupling part C has the infrared-receiving-side-end coupling portion C5 opposed to a portion of the first pattern wiring part 36A extending to the vicinity of the end of the insulating film 2 on the first heat sensitive element 5A side.

As described above, in the infrared sensor 31 according to the third embodiment, since the thermal coupling part C has the infrared-receiving-side-end coupling portion C5 opposed to a portion of the first pattern wiring part 36A extending to the vicinity of the end of the insulating film 2 on the first heat sensitive element 5A side, heat can be easily transmitted from the furthermost end from the compensation side, thereby improving the thermal responsivity.

In addition, since the first pattern wiring part 36A has the tortuous portion 36a, the thermal resistance to the first terminal electrode 4A can be increased. Therefore, the first pattern wiring part 6A can extend for a long distance without extending once towards the second heat sensitive element 5B side and taking a bypass route outside the heat transfer film 37 as in the second embodiment, which can suppress the heat transfer to the first terminal electrode 4A.

The technical scope of the present invention is not limited to the aforementioned embodiments, but the present invention may be modified in various ways without departing from the scope or teaching of the present invention.

For example, in each embodiment described above, although the first heat sensitive element is configured to detect the heat transferred from the insulating film that directly receives infrared radiation, an infrared absorbing film having a higher infrared absorbency than that of the insulating film may be formed immediately above the first heat sensitive element and on either surface of the insulating film. In this case, the infrared absorbing effect can be further improved in the first heat sensitive element, and thus a favorable temperature difference between the first heat sensitive element and the second heat sensitive element can be obtained. Specifically, this infrared absorbing film may be configured to absorb infrared radiation radiated from an object to be measured, and then the heat from the infrared absorbing film, which absorbs infrared radiation and generates heat, is transferred through the insulating film so as to allow the temperature of the first heat sensitive element immediately below the film to be changed.

REFERENCE NUMERALS 1, 21, 31: infrared sensor, 2: insulating film, 3A: first adhesive electrode, 3B: second adhesive electrode, 4A: first terminal electrode, 4B: second terminal electrode, 5A: first heat sensitive element, 5B: second heat sensitive element, 6A, 36A: first pattern wiring part, 6B: second pattern wiring part, 8, 28: infrared reflection film, C: thermal coupling part, C1, C3, C4: compensation-side-vicinity coupling portion, C2: outer-edge-vicinity coupling portion, C5: infrared-receiving-side-end coupling portion, D: infrared-receiving region

What is claimed is:

1. An infrared sensor comprising:
   an insulating film;
   a pair of first terminal electrodes and a pair of second terminal electrodes that are patterned on one surface of the insulating film;
   a first heat sensitive element and a second heat sensitive element that are provided on the one surface of the insulating film;
   a pair of first pattern wiring films that is patterned on the one surface of the insulating film with one end thereof being connected to the first heat sensitive element and the other end thereof being connected to the pair of first terminal electrodes;
   a pair of second pattern wiring films that is patterned on the one surface of the insulating film with one end thereof being connected to the second heat sensitive element and the other end thereof being connected to the pair of second terminal electrodes;
   an infrared-receiving region that is provided on the other surface of the insulating film so as to oppose to the first heat sensitive element; and
   an infrared reflection film that is formed on the other surface of the insulating film so as to avoid the infrared-receiving region and to cover at least the portion immediately above the second heat sensitive element,
   wherein the infrared reflection film has a thermal coupling part in proximity to a portion of the first pattern wiring films, and the thermal coupling part and the portion of the first pattern wiring films are formed so as to oppose to each other on both surfaces of the insulating film.

2. The infrared sensor according to claim 1, wherein
   the first pattern wiring film extends to a vicinity region of an outer edge of the insulating film, and
   a part of the thermal coupling part is opposed to the first pattern wiring film in the vicinity region of an outer edge of the insulating film.

3. The infrared sensor according to claim 1, wherein
   the first pattern wiring film extends to a vicinity of the second heat sensitive element, and
   a part of the thermal coupling part is opposed to a portion of the first pattern wiring film extending to the vicinity of the second heat sensitive element.

4. The infrared sensor according to claim 1, wherein
   the first pattern wiring film extends to a vicinity of the end of the insulating film on the first heat sensitive element side, and
   a part of the thermal coupling part is opposed to a portion of the first pattern wiring film extending to the vicinity of the end of the insulating film on the first heat sensitive element side.

5. The infrared sensor according to claim 1, wherein the infrared reflection film is formed so as to also cover a periphery of the infrared-receiving region.

* * * * *